United States Patent
Deng et al.

(10) Patent No.: US 11,262,411 B2
(45) Date of Patent: Mar. 1, 2022

(54) TERMINAL APPARATUS, AND METHOD AND DEVICE FOR DETERMINING BATTERY STATE OF CHARGE

(71) Applicant: BOE TECHNOLOGY GROUP CO., LTD., Beijing (CN)

(72) Inventors: Wei Deng, Beijing (CN); Hongtao Guan, Beijing (CN); Kai Zhao, Beijing (CN); Zhichao Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/043,840

(22) PCT Filed: Dec. 18, 2019

(86) PCT No.: PCT/CN2019/126372
§ 371 (c)(1),
(2) Date: Sep. 30, 2020

(87) PCT Pub. No.: WO2021/120061
PCT Pub. Date: Jun. 24, 2021

(65) Prior Publication Data
US 2021/0349154 A1 Nov. 11, 2021

(51) Int. Cl.
*G01R 31/3842* (2019.01)
*H02J 7/00* (2006.01)

(52) U.S. Cl.
CPC ........ *G01R 31/3842* (2019.01); *H02J 7/0048* (2020.01)

(58) Field of Classification Search
None
See application file for complete search history.

(56) References Cited

U.S. PATENT DOCUMENTS 6,285,163 B1 * 9/2001 Watanabe ............ G01R 31/389
320/132
7,456,612 B2 11/2008 Murakami
(Continued)

FOREIGN PATENT DOCUMENTS

CN 1565067 A 1/2005
CN 1948988 B 9/2010
(Continued)

OTHER PUBLICATIONS

Written Opinion of International Application No. PCT/CN2019/126372 dated Sep. 22, 2020.

*Primary Examiner* — Jas A Sanghera
(74) *Attorney, Agent, or Firm* — Thomas | Horstemeyer, LLP (57) ABSTRACT

A method for determining a battery state of charge (SOC) includes: determining a basic SOC of a battery of a terminal apparatus at a current time; determining rated and maximum power consumption parameters of the terminal apparatus in a time period between the current time and a reference time previous thereto; determining a reference SOC at the current time based on the rated power consumption parameter and an actual SOC at the reference time; determining a minimum SOC at the current time based on the maximum power consumption parameter and the actual SOC at the reference time; and judging whether the basic SOC is between the minimum SOC and the actual SOC at the reference time or not, and if yes, determining the basic SOC as an actual SOC at the current time, and if not, determining the actual SOC at the current time based on the reference and basic SOC.

20 Claims, 7 Drawing Sheets

(56) References Cited

U.S. PATENT DOCUMENTS

| | | | |
|---|---|---|---|
| 10,705,147 | B2 | 7/2020 | Shimizu |
| 2004/0257087 | A1 | 12/2004 | Murakami |
| 2017/0176541 | A1 | 6/2017 | Shimizu |

FOREIGN PATENT DOCUMENTS

| | | | |
|---|---|---|---|
| CN | 101153894 B | 9/2010 | |
| CN | 103197249 A | 7/2013 | |
| CN | 103675701 A | 3/2014 | |
| CN | 203587780 U | 5/2014 | |
| CN | 105738822 A | 7/2016 | |
| CN | 103675701 B | 8/2016 | |
| CN | 205787042 U | 12/2016 | |
| CN | 108445407 A | 8/2018 | |
| CN | 105738822 B | 11/2018 | |
| CN | 109799461 A | 5/2019 | |
| EP | 1460708 A1 | 9/2004 | |
| JP | 2006267014 A | 10/2006 | |
| JP | 1872226 B2 | 2/2012 | |

\* cited by examiner

TERMINAL APPARATUS, AND METHOD AND DEVICE FOR DETERMINING BATTERY STATE OF CHARGE

CROSS-REFERENCE TO RELATED APPLICATION

This application is a national phase application under 35 U.S.C. § 371 of International Patent Application No. PCT/CN2019/126372 filed on Dec. 18, 2019, the entire contents of which are incorporated herein by reference as a part of this application.

TECHNICAL FIELD

The present disclosure relates to the field of battery technology and, particularly, to a non-transitory computer-readable storage medium, a terminal apparatus, and a method and a device for determining a battery state of charge (SOC).

BACKGROUND

At present, a battery is an indispensable part of a terminal apparatus, such as a mobile phone, a tablet computer, and the like, to provide power for operation of the apparatus. The battery has a power decreased with the use of the terminal apparatus. In order to facilitate informing a user of charging in time, it is generally necessary to detect SOC of the battery. However, in the prior art, a method of detecting a battery SOC has a lower accuracy detection result.

It should be noted that the information disclosed in the background section above is only used to enhance the understanding of the background of the present disclosure, and therefore, may include information that does not constitute the prior art known to those of ordinary skill in the art.

SUMMARY

The present disclosure is providing a non-transitory computer-readable storage medium, a terminal apparatus, and a method and a device for determining a battery SOC.

According to one aspect of the present disclosure, there is provided a method for determining a battery SOC, comprising:

determining a basic SOC of a battery of a terminal apparatus at a current time;

determining a rated power consumption parameter and a maximum power consumption parameter of the terminal apparatus in a time period between the current time and a reference time previous thereto;

determining a reference SOC at the current time based on the rated power consumption parameter and an actual SOC at the reference time;

determining a minimum SOC at the current time based on the maximum power consumption parameter and the actual SOC at the reference time; and judging whether the basic SOC is between the minimum SOC and the actual SOC at the reference time or not, and if yes, determining the basic SOC as an actual SOC at the current time, and if not, determining the actual SOC at the current time based on the reference SOC and the basic SOC.

In one exemplary embodiment of the present disclosure, the determining of the basic SOC of the battery of the terminal apparatus at the current time comprises:

detecting a voltage of the battery of the terminal apparatus at the current time; and determining the basic SOC at the current time based on the voltage of the battery at the current time.

In one exemplary embodiment of the present disclosure, the determining of the basic SOC at the current time based on the voltage of the battery at the current time comprises:

determining the basic SOC at the current time based on the voltage at the current time and a preset voltage-charge amount corresponding relationship.

In one exemplary embodiment of the present disclosure, the voltage-charge amount corresponding relationship comprises a discharging characteristic curve of the battery.

In one exemplary embodiment of the present disclosure, the determining of the rated power consumption parameter and the maximum power consumption parameter of the terminal apparatus in the time period between the current time and the reference time previous thereto comprises:

acquiring a rated power of the terminal apparatus and a duration of the time period between the current time and the reference time previous thereto; and calculating the rated power consumption parameter and the maximum power consumption parameter of the terminal apparatus in the time period between the current time and the reference time previous thereto based on Formulae:

$$\Delta R_r = \frac{P_r \times \Delta T}{W};$$

$$\Delta R_{max} = \frac{P_{max} \times \Delta T}{W};$$

wherein $\Delta R_r$ is the rated power consumption parameter, $\Delta R_{max}$ is the maximum power consumption parameter, $P_r$ is the rated power of the terminal apparatus, $P_{max}$ is a maximum power of the terminal apparatus, $\Delta T$ is the duration of the time period between the current time and the reference time, and W is a total charge amount of the battery.

In one exemplary embodiment of the present disclosure, the determining of the reference SOC at the current time based on the rated power consumption parameter and an actual SOC at the reference time comprises:

acquiring a SOC at the reference time previous to the current time; and calculating the reference SOC at the current time based on the following Formula:

$$C_r = C_o - \Delta R_r;$$

wherein $C_r$ is the reference SOC, and $C_o$ is the actual SOC at the reference time.

In one exemplary embodiment of the present disclosure, the determining of the minimum SOC at the current time based on the maximum power consumption parameter and the actual SOC at the reference time comprises:

acquiring the actual SOC at the reference time previous to the current time; and calculating the minimum SOC at the current time based on the following Formula:

$$C_{min} = C_o - \Delta R_{max};$$

wherein $C_{min}$ is the minimum SOC, and $C_o$ is the actual SOC at the reference time In one exemplary embodiment of the present disclosure, the determining of the actual SOC at the current time based on the reference SOC and the basic SOC comprises:

calculating the actual SOC at the current time based on the following Formula:

$$C = C_r + A(C_d - C_r).$$

wherein C is the actual SOC at the current time, $C_d$ is the basic SOC, A is an adjustment coefficient, and $C_r$ is the reference SOC In one exemplary embodiment of the present disclosure, the method for determining the battery SOC further comprises:

detecting whether the battery is in a charging status or not, and if yes, determining a maximum voltage of the battery and detecting an actual voltage of the battery; and judging whether a difference of the actual voltage and the maximum voltage is in a preset range or not, and if yes, updating the maximum voltage, and updating a total charge amount of the battery based on the maximum voltage and a voltage-charge amount corresponding relationship.

In one exemplary embodiment of the present disclosure, the judging whether a difference of the actual voltage and the maximum voltage is in a preset range or not comprises:

judging whether a time during which the difference of the actual voltage and the maximum voltage is in the preset range reaches a preset duration.

According to one aspect of the present disclosure, there is provided a device for determining a battery SOC, comprising:

a first charge amount determination module for determining a basic SOC of a battery of a terminal apparatus at a current time;

a power consumption measurement module for determining a rated power consumption parameter and a maximum power consumption parameter of the terminal apparatus in a time period between the current time and a reference time previous thereto;

a second charge amount determination module for determining a reference SOC at the current time based on the rated power consumption parameter and an actual SOC at the reference time;

a third charge amount determination module for determining a minimum SOC at the current time based on the maximum power consumption parameter and the actual SOC at the reference time; and a judgment module for judging whether the basic SOC is between the minimum SOC and the actual SOC at the reference time or not, and if yes, determining the basic SOC as an actual SOC at the current time, and if not, determining the actual SOC at the current time based on the reference SOC and the basic SOC.

In one exemplary embodiment of the present disclosure, the first charge amount determination module comprises:

a voltage detection unit for detecting a voltage of the battery of the terminal apparatus at the current time; and a charge amount determination unit for determining the basic SOC at the current time based on the voltage of the battery at the current time.

In one exemplary embodiment of the present disclosure, the device for determining a battery SOC further comprises:

a charging judgment module for detecting whether the battery is in a charging status or not, and if yes, controlling the voltage detection unit to detect an actual voltage of the battery; and a charge amount updating module for obtaining a maximum voltage of the battery when the battery is in the charging status, and judging whether a difference of the actual voltage and the maximum voltage is in a preset range or not, and if yes, updating the maximum voltage, and updating a total charge amount of the battery based on the maximum voltage and a voltage-charge amount corresponding relationship.

In one exemplary embodiment of the present disclosure, there is provided a terminal apparatus comprising a power supplying circuit and a power source controlling circuit, the power supplying circuit comprising a battery, the power source controlling circuit for performing any one of the method for determining a battery SOC described as above.

In one exemplary embodiment of the present disclosure, the terminal apparatus further comprises:

a storage device for storing the rated power consumption parameter, the maximum power consumption, the actual SOC, and a duration of the time period between the current time and a reference time previous thereto.

In one exemplary embodiment of the present disclosure, the terminal apparatus further comprises:

a display device for displaying the actual SOC at the current time.

According to one aspect of the present disclosure, there is provided a readable storage medium having a computer program stored thereon, achieving the method for determining the battery SOC as the computer program being executed described as above.

It is to be understood that both the foregoing general description and the following detailed description are exemplary and explanatory only and are not restrictive of the present disclosure.

BRIEF DESCRIPTION OF THE DRAWINGS

The drawings herein, which are incorporated in and constitute a part of this specification, illustrate embodiments consistent with the present disclosure, and serve to explain the principles of the present disclosure together with the description. Understandably, the drawings in the following description are just some embodiments of the present disclosure. For those of ordinary skill in the art, other drawings may be obtained based on these drawings without creative efforts.

DESCRIPTION OF REFERENCE NUMERALS

100 device for determining battery SOC; 1 first charge amount determination module; 2 power consumption measurement module; 3 second charge amount determination module; 4 third charge amount determination module; 5 judgment module; 6 charging judgment module; 7 charge amount updating module; 8 power source controlling circuit; 9 storage device; 10 display device; 11 power supplying device; 111 battery; 112 power source adapter; 113 voltage conversion circuit; 12 load; 200 readable storage medium.

DETAILED DESCRIPTION

Example implementations will now be described more fully with reference to the accompanying drawings. However, the example implementations can be implemented in various forms and should not be construed as limited to examples set forth herein; rather, these implementations are provided so that this disclosure will be thorough and complete, and will fully convey the concept of the example implementations to those skilled in the art. The described features, structures or characteristics can be combined in one or more implementations in any suitable manners. In the following description, many specific details are provided to give a sufficient understanding of implementations of the present disclosure. However, those skilled in the art will realize that the technical solutions of the present disclosure may be practiced without omitting one or more of the specific details, or other methods, components, devices, steps, etc. may be used. In other cases, well-known technical solutions are not shown or described in detail in order to avoid overwhelming the subject and obscuring aspects of the present disclosure.

In addition, the drawings are merely schematic illustrations of the present disclosure and are not necessarily drawn to scale. The same reference numerals in the drawings denote the same or similar parts, and thus their repeated description will be omitted. Some of the block diagrams shown in the drawings are functional entities and do not necessarily have to correspond to physically or logically independent entities. These functional entities may be implemented in a form of software, or implemented in one or more hardware modules or integrated circuits, or implemented in different networks and/or processor devices and/or microcontroller devices.

The terms "a", "an", "the", and "said" are used to indicate the presence of one or more elements/components/etc.; the terms "comprising", "including" and "having" are used to indicate open-ended inclusive meanings, and means that there may be additional elements/components/etc., in addition to the listed elements/components/etc.; and the terms "first", "second", and "third" are only used as markers, not to limit the number of objects.

In the related art, for a terminal apparatus with a battery such as a mobile phone, a tablet computer and the like, detecting a SOC of the battery generally includes a coulometer method and a voltage detection method, but the coulometer method has a detection error being cumulated, that is, the error being larger with the longer use time, and thus requires an additional correction circuit and algorithm, which is more complicated and costly. However, a voltage detected by the voltage detection method fluctuates relatively large, resulting in a large fluctuation of a calculated charge amount, which requires a filtering algorithm for calculating charge amounts to be very high and difficult.

A method for determining a battery SOC is provided in an implementation of the present disclosure, which can be used to determine a SOC of a battery of a terminal apparatus that can be a mobile phone, a tablet computer, a screen, etc. The battery can be a lithium battery or other types of chargeable batteries.

Figure 1:
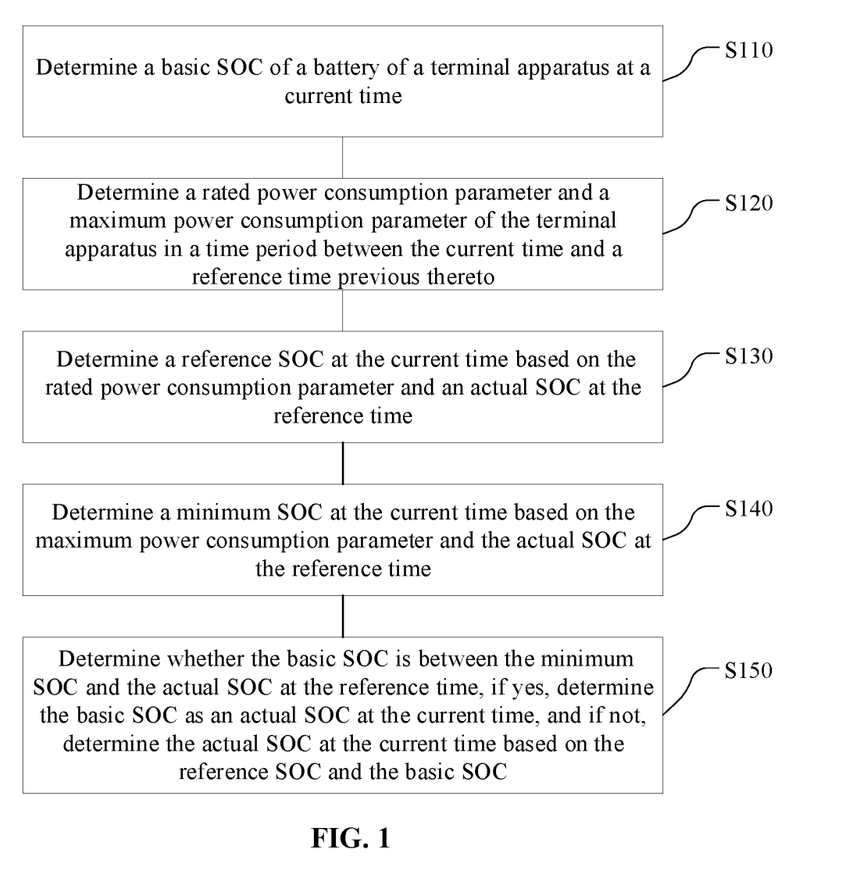
FIG. 1 is a flow chart of one implementation of a method for determining a battery SOC of the present disclosure.

As shown in FIG. 1, a method for determining a battery SOC of an implementation of the present disclosure may comprise steps S110 to S150, wherein:

in step S110, a basic SOC of a battery of a terminal apparatus at a current time is determined;

in step S120, a rated power consumption parameter and a maximum power consumption parameter of the terminal apparatus in a time period between the current time and a reference time previous thereto are determined;

in step S130, a reference SOC at the current time is determined based on the rated power consumption parameter and an actual SOC at the reference time;

in step S140, a minimum SOC at the current time is determined based on the maximum power consumption parameter and the actual SOC at the reference time; and in step S150, whether the basic SOC is between the minimum SOC and the actual SOC at the reference time or not is judged, and if yes, the basic SOC is determined as an actual SOC at the current time, and if not, the actual SOC at the current time is determined based on the reference SOC and the basic SOC.

In the method of the implementation of the present disclosure, the basic SOC can be judged to be reasonable or not through the minimum SOC at the current time and the actual SOC at the reference time. If the basic SOC is between the minimum SOC and the actual SOC at the reference time, it shows that the basic SOC is accurate, and the basic SOC can be output as the actual SOC at the current time, because the actual SOC at the current time cannot be less than the minimum SOC or greater than the actual SOC at the previous reference time. If the basic SOC is out of the minimum SOC and the actual SOC at the reference time, showing that the basic SOC has an excessively large deviation, the basic SOC can be corrected based on the reference SOC to obtain the actual SOC, thereby increasing an accuracy of the detection of the SOC. In addition, the actual SOC at the current time may be used as an actual SOC at a next time, thereby realizing cycle detection.

Hereinafter, respective steps of the method for determining the remaining battery charge amount of the implementation of the present disclosure will be described in detail.

As shown in FIG. 1, in step S110, the basic SOC of the battery of the terminal apparatus at the current time is determined.

The terminal apparatus may be an electronic apparatus with a battery such as a mobile phone, a tablet computer, a screen, etc. The battery may be a lithium battery, and may also be a nickel-cadmium battery or other types of chargeable batteries. The current time may be any time after the terminal apparatus is turned on. A voltage may be an actual voltage of the battery, which may be directly collected, or may be obtained by converting a detected voltage.

Figure 2:
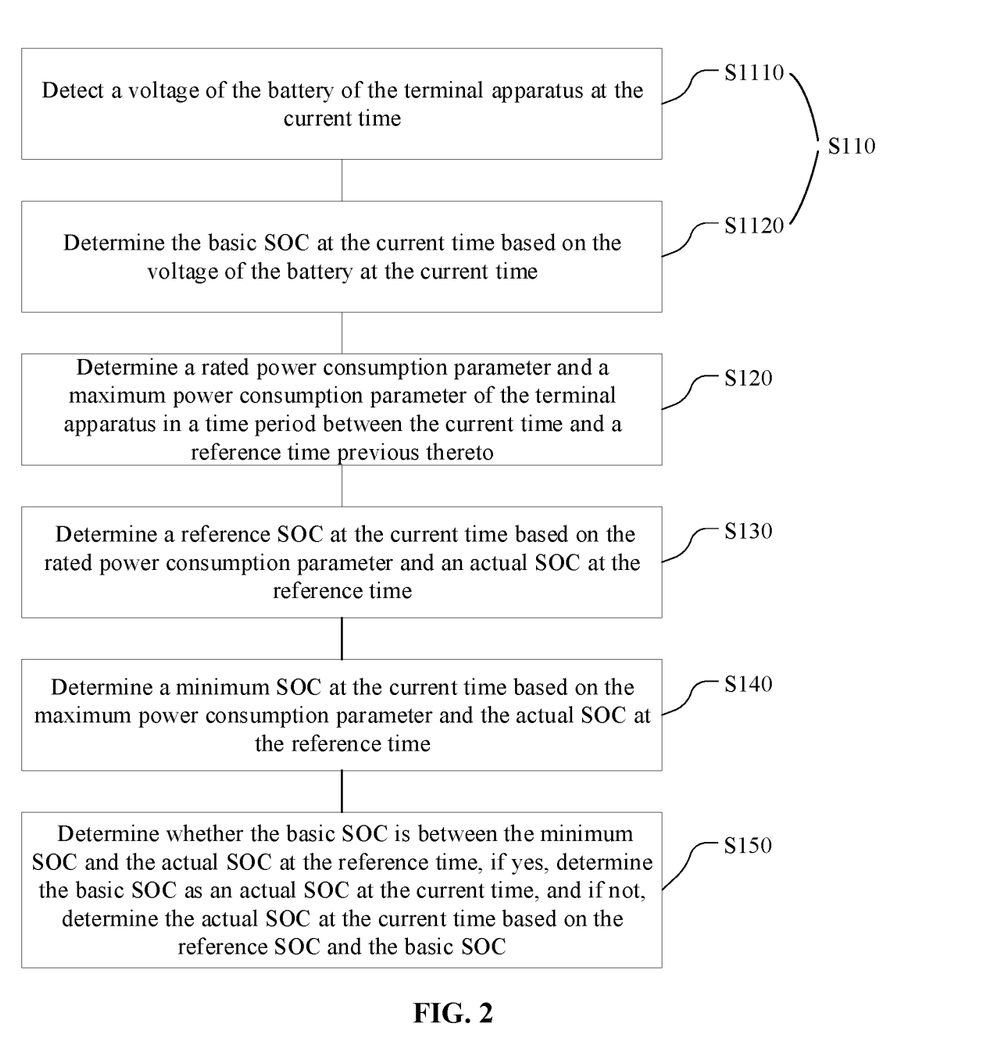
FIG. 2 is a flow chart of one implementation of a method for determining a battery SOC of the present disclosure.

The basic SOC may be determined based on a voltage of the battery of the terminal apparatus, and in particular, as shown in FIG. 2, in some implementations of the present disclosure, step S110 may include steps S1110 and S1120.

In step S1110, the voltage of the battery of the terminal apparatus at the current time is determined.

In some implementations of the present disclosure, the voltage of the battery may be detected through a voltage detection module, which may include a voltage divider circuit, an analog-to-digital converter (ADC), and a processor.

The voltage of the battery may be divided through the voltage divider circuit. The divided voltage is an intermediate voltage, which is less than an actual voltage of the battery, and may be output to the processor after being subjected to analog-to-digital conversion by the ADC to prevent the processor from receiving an excessively high voltage. The processor may be a microcomputer unit (MCU) or other chip with data processing function, and may convert the received voltage to obtain the voltage of the battery, that is, the actual voltage. The converting is determined depending on a specific structure of the voltage divider circuit. For example, a mapping relationship between the actual voltage and the intermediate voltage may be determined in advance through detection or calculation, and the actual voltage, that is, the voltage of the battery in step 1110, may be determined based on the measured intermediate voltage and the mapping relationship. The voltage divider circuit may be a resistance voltage-dividing circuit, and its specific device is not particularly limited here, as long as it can divide a voltage. In the above process, due to a limited range of the voltage detected by the processor, the voltage of the battery cannot be directly detected, so that the voltage may be reduced first by dividing the voltage to provide the processor with a voltage less than the actual voltage for the processor to detect, and then may be derived by the processor to obtain the actual voltage so as to prevent the voltage from being excessively large to burn the processor.

In step S1120, the basic SOC at the current time is determined based on the voltage of the battery at the current time.

The basic SOC at the current time may be used as a basic value of the actual SOC at the current time, and may be expressed by a ratio of the basic SOC to a total charge amount of the battery. In some implementations of the present disclosure, step S1120 may include:

determining the basic SOC at the current time based on the voltage at the current time and a preset voltage-charge amount corresponding relationship.

Figure 5:
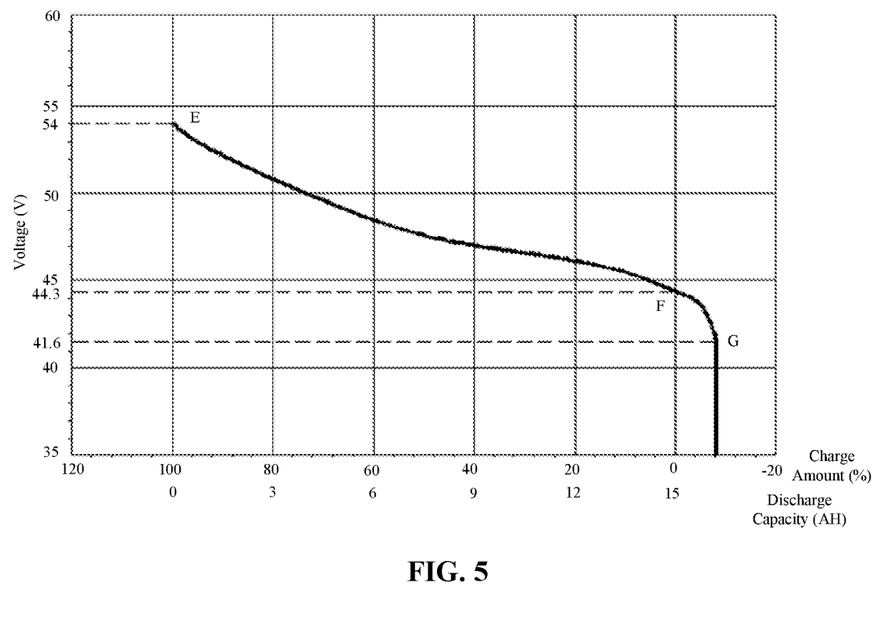
FIG. 5 is a voltage characteristic curve in one implementation of a method for determining a battery SOC of the present disclosure.

The voltage-charge amount corresponding relationship may be stored in advance, and may be called when the basic SOC is determined. The voltage-charge amount corresponding relationship may include a discharging characteristic curve of the battery, and in the case that the voltage at the current time is known, a corresponding SOC, i.e., the basic SOC at the current time, may be looked up in the discharging characteristic curve. Details of the discharging characteristic curve depend on the type and parameters of the battery, and are not specially limited thereto herein. As shown in FIG. 5, FIG. 5 illustrates a discharging characteristic curve in the case where the battery is discharged with a discharging current of 2.5 A at a rate of 0.167 C, in which the battery has a voltage of 54V and a charge amount of 100% at point E, a voltage of 44.3V and a charge amount of 0 at point F, and a voltage of 41.6V and a charge amount less than 0 at point G.

Of course, in some implementations of the present disclosure, the voltage-charge amount corresponding relationship may also be a mapping relationship between a preset voltage set and a set of basic SOC, and the basic SOC at the current time may also be determined by means of looking up a table.

As shown in FIG. 1, in step S120, the rated power consumption parameter and the maximum power consumption parameter of the terminal apparatus are determined in a time period between the current time and a reference time previous thereto.

The reference time is any time at the current time, that is, a duration (i.e., time length) of a time period between the current time and the reference time may be any duration as long as it is not zero, for example, 1s, 5s, 10s, 30s, 60s, or the like, and is not specially limited thereto herein.

The rated power consumption parameter may be a rated power consumption, that is, a power consumption of the terminal apparatus at a normal operation state in the time period between the reference time and the current time. The rated power consumption parameter may also be a ratio of the rated power consumption to the total charge amount of the battery. The maximum power consumption parameter may be a maximum power consumption, that is, a maximum power consumption of the terminal apparatus in the time period between the reference time and the current time. The maximum power consumption parameter may also be a ratio of the maximum power consumption to the total charge amount of the battery.

In some implementations of the present disclosure, steps S120 may include steps S1210 and 1220.

In step S1210, a rated power of the terminal apparatus and the duration of the time period between the current time and the reference time previous thereto are obtained.

The duration of the time period between the current time and the reference time may be stored or set in advance, and thus may be directly acquired, and after the duration of the time period between the current time and the reference time is determined, the reference time may be determined.

In step S1220, the rated power consumption parameter and the maximum power consumption parameter of the terminal apparatus in the time period between the current time and the reference time previous thereto based on the following Formulae:

$$\Delta R_r = \frac{P_r \times \Delta T}{W}; \quad (I)$$

$$\Delta R_{max} = \frac{P_{max} \times \Delta T}{W}; \quad (II)$$

wherein $\Delta R_r$ is the rated power consumption parameter at the time period $\Delta T$, which is a ratio of a rated power consumption at the time period $\Delta T$ to the total amount of the battery; $\Delta R_{max}$ is the maximum power consumption parameter at the time period $\Delta T$, which is a ratio of a maximum power consumption at the time period $\Delta T$ to the total amount of the battery; $P_r$ is the rated power of the terminal apparatus, $P_{max}$ is a maximum power of the terminal apparatus, $\Delta T$ is the duration of the time period between the current time and the reference time, and W is the total charge amount of the battery.

The rated power $P_r$, the maximum power $P_{max}$, and the duration $\Delta T$ of the time period between the current time and the reference time of the terminal apparatus may be stored in a storage in advance so as to be read when being used. The total charge amount W of the battery may be obtained through the voltage-charge amount corresponding relationship each time when the battery is full charged.

The above Formulae (I) and (II) may be derived as follows.

The power consumption $\Delta W$ of the battery in the time period $\Delta T$ satisfies the following Formula:

$$\Delta W = P \times \Delta T; \quad (III)$$

wherein P is a power of the terminal apparatus.

A ratio of a power consumption of the battery in the time period $\Delta T$ to the total amount of the battery is:

$$\Delta R = \frac{\Delta W}{W}; \quad (IV)$$

wherein ΔW is the power consumption of the battery in the time period ΔT, and W is the total charge amount of the battery.

It may be obtained based on the above Formulae (III) and (IV):

$$\Delta R = \frac{P \times \Delta T}{W}; \quad (V)$$

the Formulae (I) and (II) may be obtained by replacing $\Delta R_r$, $\Delta R_{max}$, $P_r$ and $P_{max}$ in the Formula (V).

As shown in FIG. 1, in step S130, the reference SOC at the current time is determined based on the rated power consumption parameter and the actual SOC at the reference time.

The rated power consumption parameter may be a power consumption of the terminal apparatus at a normal operation state in the time period between the reference time and the current time, i.e., a rated power consumption, or may be a ratio of the rated power consumption to the total charge amount of the battery. Since the actual SOC at the current time is obtained through gradual consumption on a basis of the actual SOC at the reference time, consumption of the charge amount is a rated power consumption at the time period between the reference time and the current time, and thus the reference SOC at the current time may be obtained, which may be used as an expected value of the actual SOC at the current time. A basic SOC having a relatively larger deviation may be corrected based on the expected value so as to increase accuracy.

In some implementations of the present disclosure, step S130 may include steps S1310 and S1320.

In step S1310, the actual SOC at the reference time previous to the current time is acquired.

The relation of the current time and the reference time has been described hereinabove.

In step S1320, a reference SOC at the current time is calculated based on the following Formula:

$$C_r = C_o - \Delta R_r; \quad (VI)$$

wherein $C_r$ is the reference SOC at the current time, $C_o$ is the actual SOC at the reference time, and $\Delta R_r$ is the rated power consumption parameter in the time period between the current time and the reference time. It should be noted that if the rated power consumption $\Delta R_r$ is a ratio of the rated power consumption to the total charge amount of the battery, the reference SOC $C_r$ and the actual SOC $C_o$ are respectively expressed by ratios of respective amounts to the total charge amounts of the battery. If the rated power consumption parameter directly uses the rated power consumption, the reference SOC $C_r$ and the actual SOC $C_o$ may be values of respective charge amounts without being embodied in a form of ratio.

As shown in FIG. 1, in step S140, the minimum SOC at the current time is determined based on the maximum power consumption parameter and the actual SOC at the reference time.

Since the actual SOC at the current time is obtained through gradual consumption on the basis of the actual SOC at the reference time, consumption of the charge amount is a maximum power consumption at the time period between the reference time and the current time, and thus the minimum SOC at the current time, that is, a minimum value of the actual SOC at the current time, may be obtained. The maximum power consumption parameter may be a power consumption of the terminal apparatus operating at the maximum power in the time period between the reference time and the current time, i.e., the maximum power consumption, or may also be a ratio of the maximum power consumption to the total charge amount of the battery.

In some implementations of the present disclosure, step S140 may include:

calculating the minimum SOC at the current time based on the following Formula:

$$C_{min} = C_o - \Delta R_{max}; \quad (VII)$$

wherein $C_{min}$ is a ratio of the minimum SOC at the current time to the total amount of the battery, and $C_o$ is a ratio of the actual SOC at the reference time to the total amount of the battery.

As shown in FIG. 1, in step S150, whether the basic SOC is between the minimum SOC and the actual SOC at the reference time or not is judged, and if yes, the basic SOC is output as the actual SOC at the current time and is stored, and if not, the actual SOC at the current time is determined based on the reference SOC and the basic SOC and is stored.

Since the minimum SOC at the current time is determined based on the maximum power consumption parameter in the time period between the reference time and the current time, the minimum SOC at the current time is necessarily less than the actual SOC at the reference time, and the actual SOC at the current time cannot be less than the minimum SOC; and meanwhile, the actual SOC at the current time is obtained through consumption on a basis of the actual SOC at the reference time.

As such, the above-mentioned minimum SOC and the actual SOC at the reference time may be used as a boundary for deciding whether the basic SOC at the current time is reasonable, so that the basic SOC may be determined to be reasonable or not by judging whether the basic SOC at the current time is between the minimum SOC and the actual SOC at the reference time.

In particular, if the basic SOC at the current time is between the minimum SOC at the current time and the actual SOC at the reference time, which shows that the basic SOC at the current time is reasonable, the basic SOC at the current time may be used as the actual SOC at the current time and be stored, and may be used as a reference SOC used when an actual SOC at a next time is determined. That is to say, the following Formula is satisfied:

$$C = C_d, (C_{min} \leq C_d \leq C_o); \quad (VIII)$$

wherein C is the actual SOC at the current time, $C_d$ is the basic SOC at the current time, $C_{min}$ is the minimum SOC at the current time, and $C_o$ is the actual SOC at the reference time.

If the basic SOC is less than the minimum SOC or greater than the actual SOC at the reference time, that is, not between the minimum SOC at the current time and the actual SOC at the reference time, the actual SOC at the current time is determined based on the reference SOC and the basic SOC, and is stored.

As described above, the basic SOC at the current time is not between the minimum SOC at the current time and the actual SOC at the reference time, it shows that the basic SOC obviously go beyond the reasonable range, and at this time, the actual SOC at the current time is determined based on the reference SOC at the current time and the basic SOC, and is stored, thereby avoiding directly outputting a basic SOC having an excessively large deviation. When the actual SOC at the current time is stored, it may be written in a storage and overwrites a pervious actual SOC, so that the actual SOC updates as time elapses, and at the same time, it may be transferred to a display device to display the actual SOC by means of communication ways such as UART, SRT, or the like.

Figure 6:
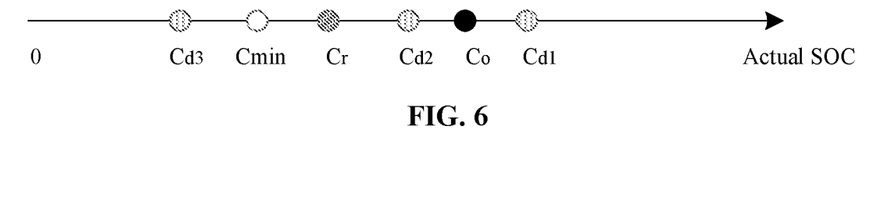
FIG. 6 is a diagram of a distribution relationship of a basic SOC and an actual SOC in a method for determining a battery SOC of the present disclosure.

In some implementations of the present disclosure, when $C_d = C_{d1}$ or $C_d = C_{d3}$, it means that the reference SOC at the current time has a small variation range as compared with the actual SOC at the current time, and thus if the basic SOC at the current time varies relatively large, the reference SOC may be used as a basic value, and the actual SOC may be calculated by using a difference of the basic SOC and the reference SOC as an adjustment factor of the reference SOC. In particular, determining the actual SOC at the current time based on the reference SOC and the basic SOC may include:

calculating the actual SOC at the current time based on the following Formula:

$$C = C_r + A(C_d - C_r), (C_d < C_{min} \text{ or } C_d > C_o); \quad (IX)$$

wherein C is the actual SOC at the current time, $C_d$ is the basic SOC at the current time, $C_r$ is the reference SOC at the current time, and A is an adjustment coefficient, and is greater than zero (A>0). The adjustment coefficient A may be determined through experiments in advance, and depends on voltage fluctuation of a battery and detection accuracy of a voltage detection module. The voltage detection module may be a circuit capable of detecting voltages, and the greater the voltage fluctuation of the battery is, the lower the detection accuracy of the voltage detection module is, and the smaller the value of A is. Specific values thereof are not specially limited hereto.

By combining the Formulae (VIII) and (IX), an equation for determining the actual SOC at the current time can be obtained:

$$C = \begin{cases} C_d, (C_{min} \leq C_d \leq C_o) \\ C_r + A(C_d - C_r), (C_d < C_{min} \text{ or } C_d < C_o) \end{cases}. \quad (X)$$

The actual SOC C at the current time may be calculated from the equation (X), in which definitions of respective parameters have been explained above and will not be repeated here.

As shown in FIG. 6, $C_{d1}$, $C_{d2}$ and $C_{d3}$ in FIG. 6 are three example values of Ca, wherein $C = C_r + A(C_{d1} - C_r)$ if $C_d = C_{d1}$, $C = C_r + A(C_{d3} - C_r)$ if $C_d = C_{d3}$, and $C = C_d$ if $C_d = C_{d2}$.

It should be noted that the above-described maximum power consumption parameter and the rated power consumption parameter can adopt ratios of the maximum power consumption and the rated power consumption to a total charge amount of the battery, and be expressed as percentages, respectively, and the rated power consumption and the maximum power consumption may have a unit of mAh; correspondingly, the basic SOC, the minimum SOC, the reference SOC, the actual SOC and the total charge amount of the battery are respective ratios in the total charge amount of the battery, being expressed as percentages. For example, the total charge amount of the battery is 100%, and the basic SOC may be 50%, etc.

Figure 3:
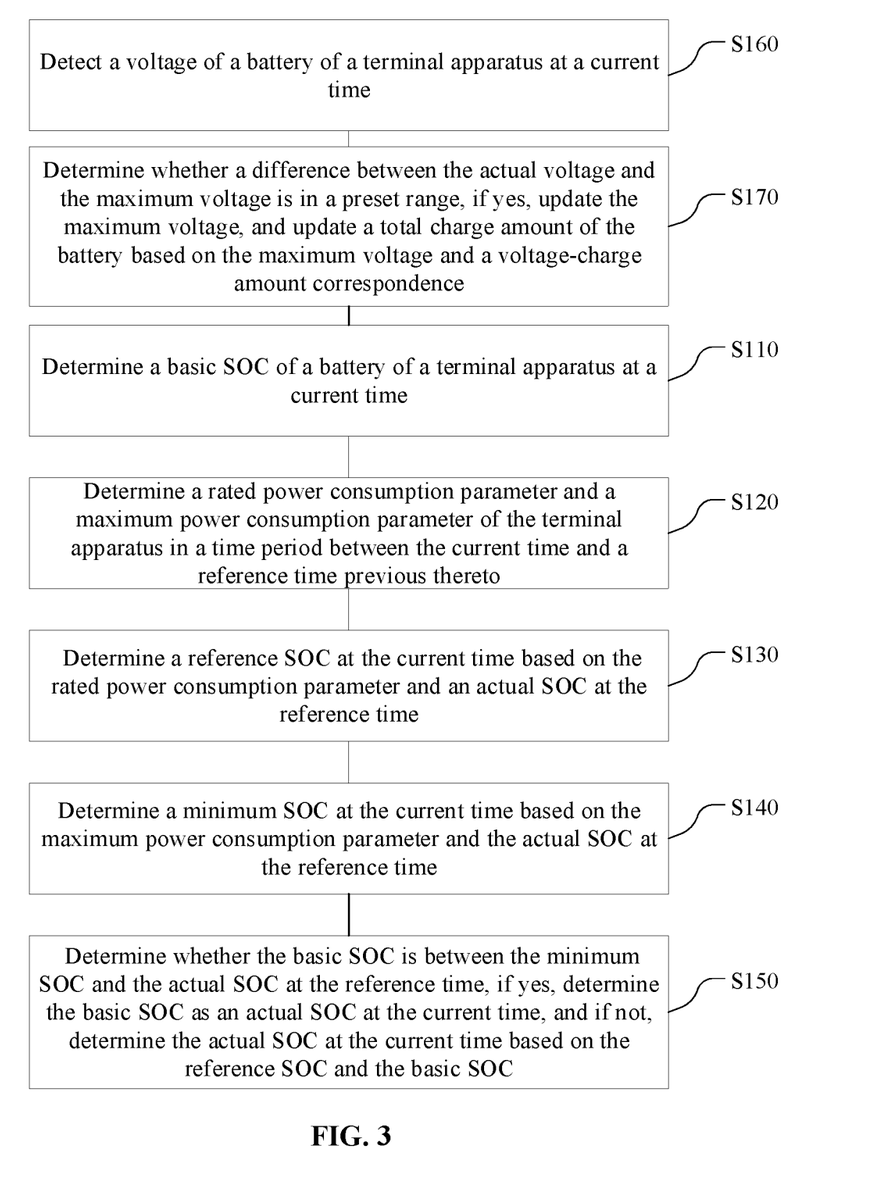
FIG. 3 is flow chart of one implementation of a method for determining a battery SOC of the present disclosure.

On the basis of any of the above implementations, since an internal resistance of the battery may increase with the use time, which affects the total charge amount of the battery, i.e., the capacity of the battery, the total charge amount of the battery stored in advance can be dynamically adjusted to ensure its accuracy. In particular, as shown in FIG. 3, in some implementations of the present disclosure, the method for determining a battery SOC may further include steps S160 and S170.

In step S160, a battery is detected to be whether in a charging status or not, and if yes, a maximum voltage of the battery is acquired, and an actual voltage of the battery is detected.

A voltage of a power source adapter of a terminal apparatus may be detected by a voltage detection unit such as MCU, or the battery may also be determined to be whether in a charging state or not by detecting pins of a battery management chip used to control switching between the battery and a power source.

At the same time, when it is judged that the battery is in a charging state, a maximum voltage of the battery may be acquired, and an actual voltage of the battery may be detected. The maximum voltage is a voltage of the battery without aging, of which specific values depend on a type of the battery, and the maximum voltage may be stored in advance to be called. The actual voltage of the battery may be a voltage of the battery detected by the voltage detection unit hereinabove, i.e., the voltage of the battery detected in step S1110 may be directly acquired.

In step S170, a difference of the actual voltage and the maximum voltage is judged to be whether in a preset range or not, and if yes, the maximum voltage is updated and a total charge amount of the battery is updated based on the maximum voltage and a voltage-charge amount corresponding relationship.

The difference of the maximum voltage of the battery and the actual voltage may be used as a basis for judgment. When the difference is within the preset range, the maximum voltage may be updated. For example, a maximum value of the actual voltage may be stored as a new maximum voltage to be called. At the same time, a total charge amount of the battery may be re-determined according to the updated maximum voltage and the voltage-charge amount corresponding relationship mentioned above, and is updated. As such, adjusting the total charge amount of the battery may be adjusted by judging the voltage of the battery. If the difference is not in the preset range, it returns to step S160.

Values of the preset range are not limited thereto, and for example, may be 0-0.5V or 0.2-1V, etc., and are not specifically listed here.

Further, in step S170, judging whether a difference of the actual voltage and the maximum voltage is in a preset range or not may include:

judging whether a time during which the difference of the actual voltage and the maximum voltage is in the preset range reaches a preset duration.

In particular, the difference between the actual voltage and the maximum voltage may be calculated in real time, and may be compared with the preset range in real time. When the difference is within the preset range, the difference is determined to be within durations in the preset range, and then the duration is compared with the preset duration. When the duration reaches the preset duration, the difference between the actual voltage and the maximum voltage is determined to be within the preset range. As such, the influence of detection errors or instantaneous voltage changes on results may be avoided. The preset duration is greater than zero, and its upper limit is not limited. Wherein, an average value, a maximum value, or a median value, etc. of a voltage applied within the preset duration may be used as the updated maximum voltage. A value of the preset duration is not limited herein, for example, it may be 10 s, 1 min, etc., and will not be listed herein.

In addition, in order to prevent the battery and data of the terminal apparatus from being damaged due to an excessively low charge amount, after acquiring the actual SOC at the current time, the actual SOC may be compared with a threshold. The threshold may be a lowest value of actual SOC which does not cause damage to the data and the battery, such as 5%, 3%, etc., and is not specially limited herein. Of course, the threshold may also be set by a user. When the actual SOC at the current time is lower than the threshold, a low charge amount alarm may be issued, and the power of the terminal apparatus is cut off, and relevant parameters are saved to protect the terminal apparatus and its battery.

Figure 4:
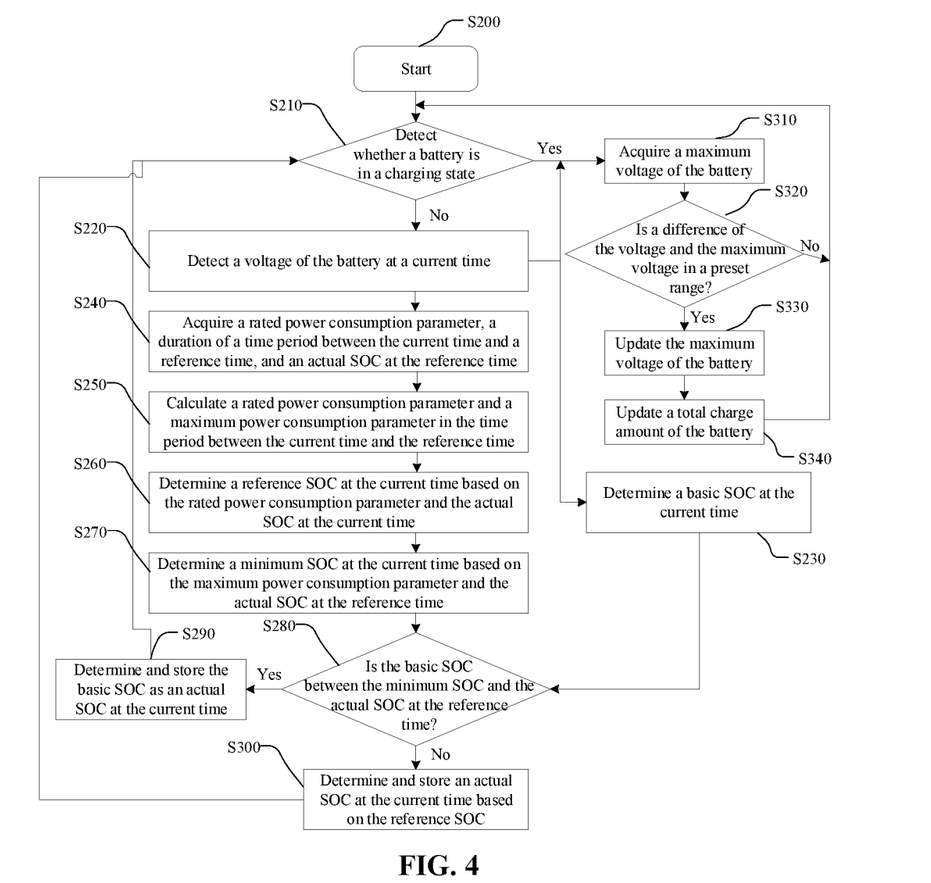
FIG. 4 is a flow chart of one implementation of a method for determining a battery SOC of the present disclosure.

As shown in FIG. 4, which is a flow chart of some implementations of a method for determining a battery SOC of the present disclosure, in some implementations, the method include:

starting in step S200.

Wherein when performing step S200, the terminal apparatus is in a startup state.

In step S210, a battery is detected to be whether in a charging state or not.

Wherein specific details of the battery are detected, which may refer to step S160 described as above, and are not described in detail herein.

In step S220, if the result of detecting in step S210 is "No", a voltage of the battery at a current time is detected.

Wherein specific details of step S220 may refer to step S1110 described as above, and are not described in detail herein.

In step S230, a basic SOC at the current time is determined.

Wherein specific details of step S230 may refer to step S1120 described as above, and are not described in detail herein.

In step S240, a rated power consumption parameter, a duration of a time period between the current time and a reference time, and an actual SOC at the reference time are acquired.

Wherein the rated power consumption parameter, the duration of the time period between the current time and the reference time, and the actual SOC at the reference time are acquired, which have been stored, may be directly acquired, and specific details thereof may refer to steps S1210 and S1310 described as above, and are not described in detail herein, wherein steps S1210 and S1310 may be performed at the same time.

In step S250, a rated power consumption parameter and a maximum power consumption parameter in the time period between the current time and the reference time are calculated.

Wherein specific details of step S250 may refer to step S1220 described as above, and are not described in detail herein.

In step S260, a reference SOC at the current time is determined based on the rated power consumption parameter and the actual SOC at the current time.

Wherein specific details of step S260 may refer to step S130 described as above, and are not described in detail herein.

In step S270, a minimum SOC at the current time is determined based on the maximum power consumption parameter and the actual SOC at the reference time.

Wherein specific details of step S270 may refer to step S140 described as above, and are not described in detail herein.

In step S280, the basic SOC is judged to be whether between the minimum SOC and the actual SOC at the reference time or not.

In step S290, if the result of judging in step S280 is "Yes", the basic SOC is output as an actual SOC at the current time, and is stored.

In step S300, if the result of judging in step S280 is "No", the actual SOC at the current time is determined based on the reference SOC and the basic SOC, and is stored.

Wherein specific details of steps S280 to S300 may refer to step S150 described as above, and are not described in detail herein.

In step S310, if the result of judging in step S210 is "Yes", a maximum voltage of the battery is acquired.

Wherein specific details of step S310 may refer to step S160 described as above, and are not described in detail herein. An actual voltage of the battery may be the voltage of the battery detected in step S220.

In step S320, a difference of the voltage and the maximum voltage is judged whether to be in a preset range or not.

Wherein specific details of step S320 may refer to step S170 described as above, and are not described in detail herein.

In step S330, if the result of judging in step S320 is "Yes", a maximum voltage of the battery is acquired.

Wherein specific details of step S330 may refer to step S170 described as above, and are not described in detail herein. If the result of judging in step S320 is "No", it returns to step S210.

In step S340, a total charge amount of the battery is updated.

Wherein specific details of step S340 may refer to step S170 described as above, and are not described in detail herein. And after step S340 is performed, it returns to step S210.

Although respective steps of the method of determining the battery SOC in the present disclosure are described in a specific order in the drawings, this does not require or imply that the steps must be performed in the specific order, or all steps shown must be performed to achieve desired results. Additionally or alternatively, certain steps may be omitted, multiple steps may be combined into one step for execution, and/or one step may be split into multiple steps for execution, and the like.

Figure 7:
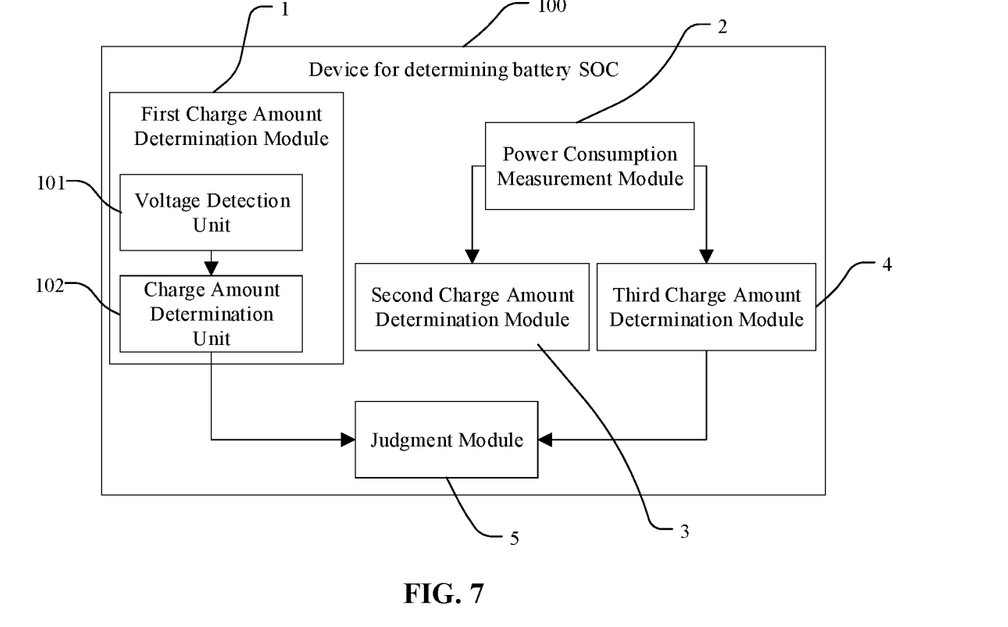
FIG. 7 is a block diagram of one implementation of a device for determining a battery SOC of the present disclosure.

An implementation of the present disclosure provides a device for determining a battery SOC, and as shown in FIG. 7, the device 100 may include a first charge amount determination module 1, a power consumption measurement module 2, a second charge amount determination module 3, a third charge amount determination module 4 and a judgment module 5.

The first charge amount determination module 1 is connected with the judgment module 5, and is configured to determine a basic SOC of a battery of a terminal apparatus at a current time.

The power consumption measurement module 2 is connected with the judgment module 5, and is configured to determine a rated power consumption parameter and a maximum power consumption parameter of the terminal apparatus in a time period between the current time and a reference time previous thereto.

The second charge amount determination module 3 is connected with the judgment module 5, and is configured to determine a reference SOC at the current time based on the rated power consumption parameter and an actual SOC at the reference time.

The third charge amount determination module 4 is connected with the judgment module 5, and is configured to determine a minimum SOC at the current time based on the maximum power consumption parameter and the actual SOC at the reference time.

The judgment module 5 is configured to judge whether the basic SOC is between the minimum SOC and the actual SOC at the reference time or not, and if yes, configured to determine the basic SOC as an actual SOC at the current time, and if not, configured to determine the actual SOC at the current time based on the reference SOC and the basic SOC.

In some implementations of the present disclosure, the first charge amount determination module 1 may include a voltage detection unit 101 and a charge amount determination unit 102.

The voltage detection unit 101 is connected with the judgment module 5 to detect a voltage of the battery of the terminal apparatus at the current time.

The charge amount determination unit 102 is connected with the judgment module 5, and is configured to determine the basic SOC at the current time based on the voltage of the battery at the current time.

Figure 8:
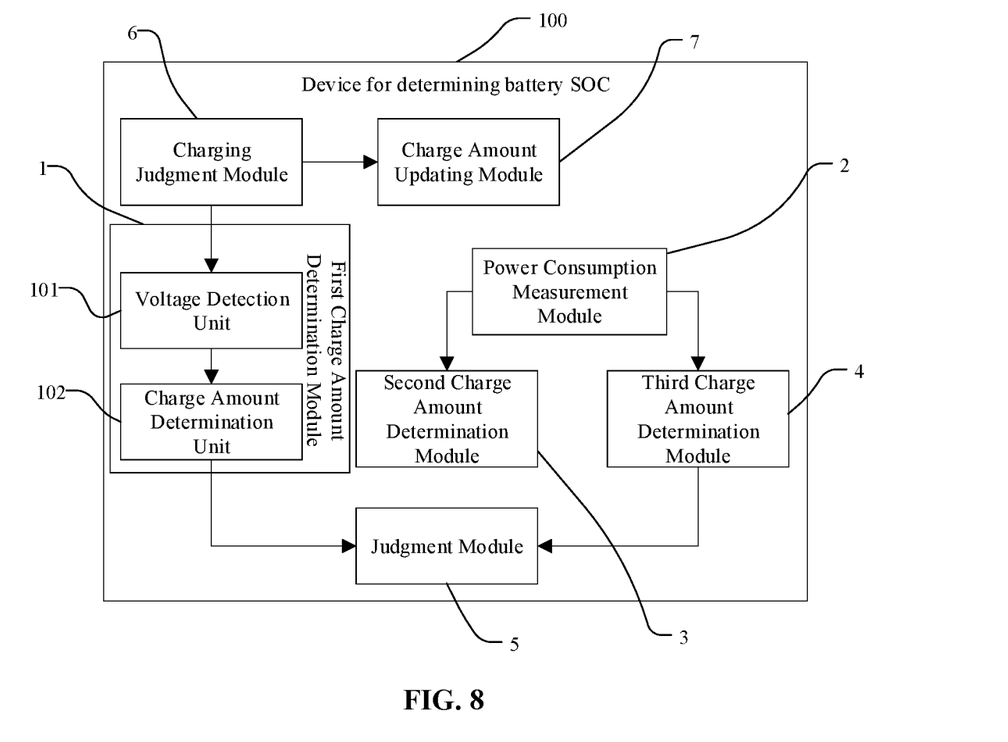
FIG. 8 is a block diagram of one implementation of a device for determining a battery SOC of the present disclosure.

In some implementations of the present disclosure, as shown in FIG. 8, the device 100 for determining the battery SOC further includes a charging judgment module 6 and a charge amount updating module 7.

The charging judgment module 6 is connected with the judgment module 5, and is configured to detect whether the battery is in a charging status or not, and if yes, configured to control the voltage detection unit 101 to detect an actual voltage of the battery.

In some implementations of the present disclosure, the charge amount updating module 7 is connected with the judgment module 5, and is configured to obtain a maximum voltage of the battery when the battery is in the charging status, and to judge whether a difference of the actual voltage and the maximum voltage is in a preset range or not, and if yes, configured to update the maximum voltage, and update a total charge amount of the battery based on the maximum voltage and a voltage-charge amount corresponding relationship.

In some implementations of the present disclosure, the first charge amount determination module 1, the power consumption measurement module 2, the second charge amount determination module 3, the third charge amount determination module 4, the judgment module 5, the charging judgment module 6 and the charge amount updating module 7 described as above may be integrated into a same power source controlling circuit which may be a microcontroller unit (MCU) or other chip.

Specific details of respective modules and units in the above device 100 have been described in detail in the method for determining the battery SOC, and therefore are not repeated herein. At the same time, beneficial effects of the device 100 for determining the battery SOC may also refer to the beneficial effects of the above method for determining the battery SOC, and are not described in detail herein.

Figure 9:
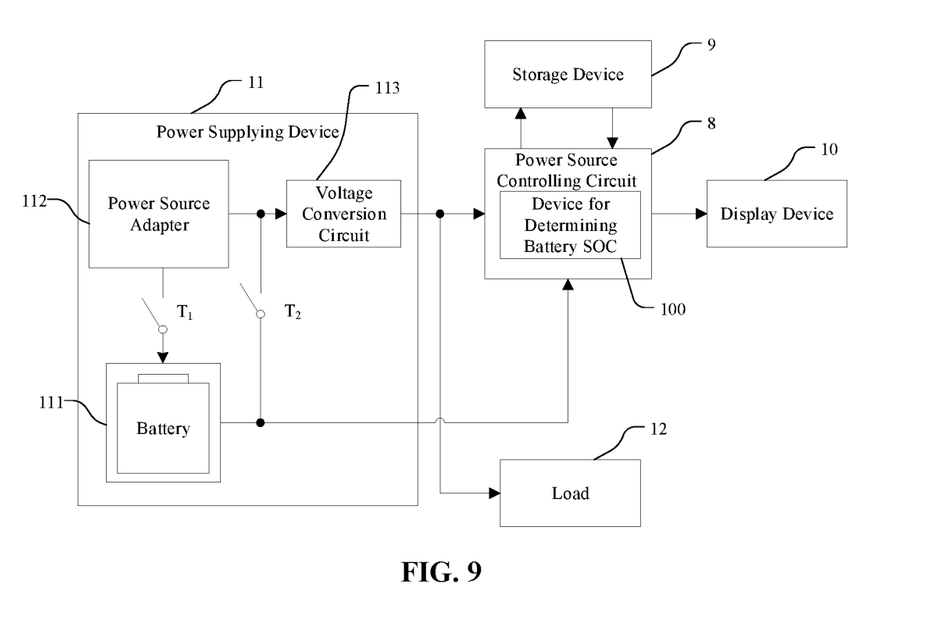
FIG. 9 is a block diagram of one implementation of a terminal apparatus of the present disclosure.

An implementation of the present disclosure provides a terminal apparatus, and as shown in FIG. 9, the terminal apparatus may include a power supplying device 11 including a battery 111, and a power source controlling circuit 8 configured to perform respective steps of the method for determining the battery SOC, and the specific contents and beneficial effects of the method may refer to the implementation of the method for determining the battery SOC, and are not repeated herein.

In some implementations of the present disclosure, as shown in FIG. 9, the terminal apparatus may further include a storage device 9 configured to store the rated power consumption, the maximum power consumption, the actual SOC, and the duration of the time period between the current time and the reference time previous thereto. The storage device 9 may include a flash memory or an EEPROM (Electrically Erasable Programmable Read Only Memory), and of course, may also use other memories, which will not be listed herein.

In some implementations of the present disclosure, as shown in FIG. 9, the terminal apparatus may further include a display device 10, which may be a liquid crystal display or the like and may display the actual SOC at the current time, so that a user may obtain the SOC and judge whether the battery is to be charged. It may be transferred to the display device 10 through communication means such as serial port, Ethernet, SPI (Serial Peripheral Interface), IIC (Inter-Integrated Circuit) or the like.

In some implementations of the present disclosure, the terminal apparatus may further include an SOC (System on Chip), to which the actual SOC may be transmitted to be stored, calculated and other processes. It may be transferred to the SOC through serial port, Ethernet, SPI, IIC and other communication means. The specific communication means is not limited here.

In some implementations, as shown in FIG. 9, the power supplying device 11 may further include the battery 111, the power source adapter 112, and the voltage conversion circuit 113. The battery 111 and the power source adapter 112 are both connected to the load 12 through the voltage conversion circuit 113. The voltage conversion circuit 113 may use an LDO (low dropout regulator) or other circuits or devices with a step-down function. The load 12 is part of the terminal apparatus, and may include devices or circuits such as chips, sensors, etc., and a specific structure thereof is not specially defined herein. At the same time, the voltage conversion circuit 113 may also be connected to the power source controlling circuit 8.

When the power source adapter 112 is connected to an external power source, the power source controlling circuit 8 may control the external power source to turn on a switch $T_1$ (that is, close the switch to turn on a circuit) to charge the battery 111, and to turn off (i.e., disconnect) a switch $T_2$ between the battery 111 and the voltage conversion circuit 113, and at this time, the external power supply may supply power to the load 12. When the power source adapter 112 is disconnected from the external power source, the power source controlling circuit 8 opens the switch $T_2$ so that the circuit between the battery 111 and the voltage conversion circuit 113 is turned on, and the battery 111 may supply power to the load 12. During this, the voltage conversion circuit 113 may convert voltages of the battery 111 and the external power source into voltages required by the power source controlling circuit 8 and the load 12.

It should be noted that the switches $T_1$ and $T_2$ are only schematically described to turn on/off of circuits, and do not constitute a limitation on actual circuits of the terminal apparatus. The switches $T_1$ and $T_2$ may be transistors, or may be other devices or circuits achieving the same functions, and are not specially defined herein.

An implementation of the present disclosure also provides a readable storage medium in which a program product capable of implementing the method for determining the battery SOC described above in this specification is stored. In some implementations, various aspects of the present disclosure may also be implemented in a form of a program product, which includes program code, and when the program product runs on a terminal apparatus, the program code is used to make the terminal apparatus to perform steps according to various exemplary implementations of the present disclosure described in the methods of determining the battery SOC described as above in this specification.

Figure 10:
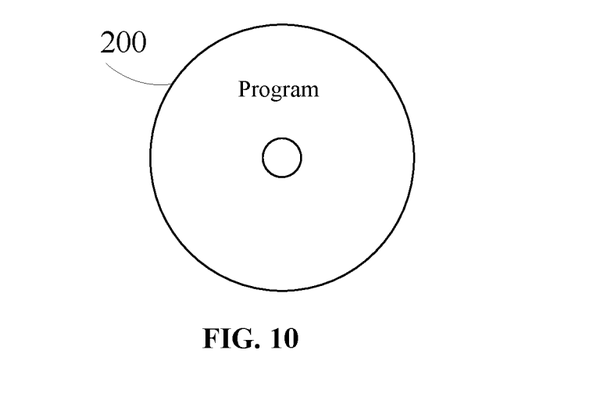
FIG. 10 is a schematic view of one implementation of a readable storage medium of the present disclosure.

As shown in FIG. 10, a program product 200 for implementing the above method according to an implementation of the present disclosure is described. It may use portable compact disk read-only memory (CD-ROM) and include program code, and may run on a terminal apparatus such as a personal computer (PC). However, the program product of the present disclosure is not limited thereto. In this document, the readable storage medium 200 may be any tangible medium containing or storing a program, which may be used by or in combination with an instruction execution system, device, or device.

The program product may employ any combination of one or more readable media. The readable medium may be a readable signal medium or a readable storage medium. The readable storage medium may be, for example but not limited to, an electrical, magnetic, optical, electromagnetic, infrared, or semiconductor system, apparatus, or device, or any combination of the above. More specific examples (non-exhaustive list) of the readable storage medium include electrical connections with one or more wires, a portable disk, a hard disk, random access memory (RAM), read only memory (ROM), erasable programmable read-only memory (EPROM or flash memory), optical fiber, portable CD-ROM, optical storage device, magnetic storage device, or any suitable combination thereof.

The computer-readable signal medium may include a data signal that is propagated in baseband or as part of a carrier wave, in which readable program code is carried. The propagated data signal may take many forms, including but not limited to electromagnetic signals, optical signals, or any suitable combination thereof. The readable signal medium may also be any readable medium other than a readable storage medium, and may send, propagate, or transmit a program for use by or in combination with an instruction execution system, apparatus, or device.

The program code contained in the readable medium may be transmitted by means of any appropriate medium, including but not limited to wireless, wired, optical fiber cable, RF, etc., or any suitable combination thereof.

The program code for performing operations of the present disclosure may be written in any combination of one or more programming languages including object-oriented programming languages such as Java, C++, etc., as well as conventional procedural programming languages such as "C" language or similar programming language. The program code may be executed entirely in a user computing apparatus, partly in a user apparatus, as an independent software package, partly in a user computing apparatus and partly in a remote computing apparatus, or entirely in a remote computing apparatus or server. In the case of remote computing apparatus, the remote computing apparatus may be connected to a user computing apparatus by means of any kind of network, including a local area network (LAN) or wide area network (WAN), or may be connected to an external computing apparatus, for example, by means of the Internet by using Internet Service Provider (ISP).

Through the description of the above implementations, those skilled in the art easily understand that the example implementations described herein may be implemented by software, or may be implemented by software in combination with necessary hardware. Therefore, the technical solution according to the implementations of the present disclosure may be embodied in the form of a software product, which may be stored in a non-volatile, non-transitory storage medium that may be a CD-ROM, U disk, mobile hard disk, etc. or on a network, and include several instructions such that a computing device which may be a personal computer, server, mobile terminal, or network apparatus, etc. performs the method according to the implementations of the present disclosure.

Those skilled in the art will readily contemplate other embodiments of the present disclosure after considering the specification and practicing the invention disclosed herein. This application is intended to cover any variations, uses, or adaptations of the present disclosure that conform to the general principles of the disclosure and include the common general knowledge or conventional technical means in the technical field not disclosed by the disclosure. It is intended that the specification and embodiments be considered as exemplary only, with a true scope and spirit of the disclosure being indicated by the appended claims.

What is claimed is:

1. A method for determining a battery state of charge (SOC), comprising:
    determining a basic SOC of a battery of a terminal apparatus at a current time;
    determining a rated power consumption parameter and a maximum power consumption parameter of the terminal apparatus in a time period between the current time and an earlier reference time;
    determining a reference SOC at the current time based on the rated power consumption parameter and an actual SOC at the reference time;
    determining a minimum SOC at the current time based on the maximum power consumption parameter and the actual SOC at the reference time; and
    determining whether the basic SOC is between the minimum SOC and the actual SOC at the reference time, if yes, determining the basic SOC as an actual SOC at the current time, and if not, determining the actual SOC at the current time based on the reference SOC and the basic SOC.

2. The method according to claim 1, wherein determining the basic SOC of the battery of the terminal apparatus at the current time comprises:
    detecting a voltage of the battery of the terminal apparatus at the current time; and
    determining the basic SOC at the current time based on the voltage of the battery at the current time.

3. The method according to claim 2, wherein determining the basic SOC at the current time based on the voltage of the battery at the current time comprises:
    determining the basic SOC at the current time based on the voltage at the current time and a preset correspondence between voltages and charge amounts.

4. The method according to claim 3, wherein the correspondence between voltages and charge amounts comprises a discharging characteristic curve of the battery.

5. The method according to claim 2, wherein determining the rated power consumption parameter and the maximum power consumption parameter of the terminal apparatus in the time period between the current time and the reference time comprises:
    acquiring a rated power of the terminal apparatus and a duration of the time period between the current time and the reference time; and
    deriving the rated power consumption parameter and the maximum power consumption parameter of the terminal apparatus in the time period between the current time and the reference time based on following equations:

$$\Delta R_r = \frac{P_r \times \Delta T}{W};$$

$$\Delta R_{max} = \frac{P_{max} \times \Delta T}{W},$$

where $\Delta R_r$ is the rated power consumption parameter, $\Delta R_{max}$ is the maximum power consumption parameter, $P_r$ is the rated power of the terminal apparatus, $P_{max}$ is a maximum power of the terminal apparatus, $\Delta T$ is the duration of the time period between the current time and the reference time, and W is a total charge amount of the battery.

6. The method according to claim 5, wherein determining the reference SOC at the current time based on the rated power consumption parameter and the actual SOC at the reference time comprises:
   acquiring an SOC at the reference time previous to the current time; and
   deriving the reference SOC at the current time based on a following equation:

$C_r = C_o - \Delta R_r,$ where $C_r$ is the reference SOC, and $C_o$ is the actual SOC at the reference time.

7. The method according to claim 5, wherein determining the minimum SOC at the current time based on the maximum power consumption parameter and the actual SOC at the reference time comprises:
   acquiring the actual SOC at the reference time previous to the current time; and
   deriving the minimum SOC at the current time based on a following equation:

$C_{min} = C_o - \Delta R_{max},$ where $C_{min}$ is the minimum SOC, and $C_o$ is the actual SOC at the reference time.

8. The method according to claim 2, wherein determining the actual SOC at the current time based on the reference SOC and the basic SOC comprises:
   deriving the actual SOC at the current time based on a following equation:

$C = C_r + A(C_d - C_r),$ where C is the actual SOC at the current time, $C_d$ is the basic SOC, A is an adjustment coefficient, and $C_r$ is the reference SOC.

9. The method according to claim 2, further comprising:
   detecting whether the battery is in a charging status, and if yes, acquiring a maximum voltage of the battery and detecting an actual voltage of the battery; and
   determining whether a difference between the actual voltage and the maximum voltage is in a preset range, if yes, updating the maximum voltage, and updating a total charge amount of the battery based on the maximum voltage and a correspondence between voltages and charge amounts.

10. The method according to claim 9, wherein determining whether the difference between the actual voltage and the maximum voltage is in the preset range comprises:
    determining whether a time period during which the difference between the actual voltage and the maximum voltage is in the preset range reaches a preset duration.

11. A device for determining a battery state of charge (SOC), comprising:
    at least one hardware processor; and
    a memory storing program instructions executable by the at least one hardware processor that, when executed, direct the at least one hardware processor to:
    determine a basic SOC of a battery of a terminal apparatus at a current time;
    determine a rated power consumption parameter and a maximum power consumption parameter of the terminal apparatus in a time period between the current time and an earlier reference time;
    determine a reference SOC at the current time based on the rated power consumption parameter and an actual SOC at the reference time;
    determine a minimum SOC at the current time based on the maximum power consumption parameter and the actual SOC at the reference time; and
    determine whether the basic SOC is between the minimum SOC and the actual SOC at the reference time, if yes, determining the basic SOC as an actual SOC at the current time, and if not, determining the actual SOC at the current time based on the reference SOC and the basic SOC.

12. The device according to claim 11, wherein the at least one hardware processor is further directed to:
    detect a voltage of the battery of the terminal apparatus at the current time; and
    determine the basic SOC at the current time based on the voltage of the battery at the current time.

13. The device according to claim 12, wherein the at least one hardware processor is further directed to:
    determine the basic SOC at the current time based on the voltage at the current time and a preset correspondence between voltages and charge amounts.

14. The device according to claim 12, wherein the at least one hardware processor is further directed to:
    acquire a rated power of the terminal apparatus and a duration of the time period between the current time and the reference time; and
    derive the rated power consumption parameter and the maximum power consumption parameter of the terminal apparatus in the time period between the current time and the reference time based on following equations:

$$\Delta R_r = \frac{P_r \times \Delta T}{W};$$

$$\Delta R_{max} = \frac{P_{max} \times \Delta T}{W},$$

where $\Delta R_r$ is the rated power consumption parameter, $\Delta R_{max}$ is the maximum power consumption parameter, $P_r$ is the rated power of the terminal apparatus, $P_{max}$ is a maximum power of the terminal apparatus, $\Delta T$ is the duration of the time period between the current time and the reference time, and W is a total charge amount of the battery.

15. The device according to claim 12, wherein the at least one hardware processor is further directed to derive the actual SOC at the current time based on a following equation:

$C = C_r + A(C_d - C_r),$ where C is the actual SOC at the current time, $C_d$ is the basic SOC, A is an adjustment coefficient, and $C_r$ is the reference SOC.

16. The device according to claim 12, wherein the at least one hardware processor is further directed to:
    detect whether the battery is in a charging status, and if yes, acquiring a maximum voltage of the battery and detecting an actual voltage of the battery; and
    determine whether a difference between the actual voltage and the maximum voltage is in a preset range, if yes, updating the maximum voltage, and updating a total charge amount of the battery based on the maximum voltage and a correspondence between voltages and charge amounts.

17. The device according to claim 11, wherein the device is a terminal apparatus comprising a power supplying circuit and a power source controlling circuit, the power supplying circuit comprising a battery.

18. The device according to claim 17, wherein the terminal apparatus comprises a storage device, the terminal device being configured to store the rated power consumption parameter, the maximum power consumption, the actual SOC, and a duration of the time period between the current time and the reference time in the storage device.

19. The device according to claim 17, wherein the terminal apparatus further comprises a display device configured to display the actual SOC at the current time.

20. A non-transitory computer-readable storage medium having program code stored thereon that, when executed by at least one hardware processor, directs the at least one hardware processor to perform a method for determining a battery state of charge (SOC), comprising:
    determining a basic SOC of a battery of a terminal apparatus at a current time;
    determining a rated power consumption parameter and a maximum power consumption parameter of the terminal apparatus in a time period between the current time and an earlier reference time;
    determining a reference SOC at the current time based on the rated power consumption parameter and an actual SOC at the reference time;
    determining a minimum SOC at the current time based on the maximum power consumption parameter and the actual SOC at the reference time; and
    determining whether the basic SOC is between the minimum SOC and the actual SOC at the reference time, if yes, determining the basic SOC as an actual SOC at the current time, and if not, determining the actual SOC at the current time based on the reference SOC and the basic SOC.

\* \* \* \* \*